(12) United States Patent
Kim et al.

(10) Patent No.: US 9,608,227 B2
(45) Date of Patent: Mar. 28, 2017

(54) ORGANIC LIGHT EMITTING DIODE DISPLAY

(71) Applicant: Samsung Display Co., Ltd., Yongin-si, Gyeonggi-do (KR)

(72) Inventors: Dong Chan Kim, Gunpo-si (KR); Won Jong Kim, Suwon-si (KR); Won Suk Han, Yongin-si (KR); Eung Do Kim, Seoul (KR); Dong Kyu Seo, Hwaseong-si (KR); Ji Hye Lee, Incheon (KR); Sang Hoon Yim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/013,710

(22) Filed: Feb. 2, 2016

(65) Prior Publication Data

US 2016/0351845 A1   Dec. 1, 2016

(30) Foreign Application Priority Data

May 28, 2015   (KR) .................. 10-2015-0074879

(51) Int. Cl.
| | |
|---|---|
| *H01L 27/32* | (2006.01) |
| *H01L 51/52* | (2006.01) |
| *H01L 51/50* | (2006.01) |

(52) U.S. Cl.
CPC ...... *H01L 51/5212* (2013.01); *H01L 27/3248* (2013.01); *H01L 51/5072* (2013.01); *H01L 51/5092* (2013.01); *H01L 51/5228* (2013.01); *H01L 2251/301* (2013.01); *H01L 2251/558* (2013.01)

(58) Field of Classification Search
CPC ............ H01L 51/5212; H01L 27/3248; H01L 51/5092; H01L 51/5228; H01L 51/5072; H01L 2251/301; H01L 2251/558
See application file for complete search history.

(56) References Cited

U.S. PATENT DOCUMENTS

| | | | | |
|---|---|---|---|---|
| 3,443,997 A | * | 5/1969 | Owens .................. | H01M 6/182 361/434 |
| 3,476,605 A | * | 11/1969 | Owens .................. | H01M 6/182 429/213 |

(Continued)

FOREIGN PATENT DOCUMENTS

| | | |
|---|---|---|
| KR | 10-2008-0011623 A | 2/2008 |
| KR | 10-1182447 B1 | 9/2012 |

OTHER PUBLICATIONS

Cao et al., "Preparation and Structural Characterization of Superionic Conductor $RbAg_4I_5$ Crystalline Grain Film," Chinese Physics Letters, vol. 20, No. 5 (2003), pp. 756-758.

*Primary Examiner* — Jarrett Stark
(74) *Attorney, Agent, or Firm* — Lewis Roca Rothgerber Christie LLP

(57) ABSTRACT

An organic light emitting diode (OLED) display includes: a thin film transistor on the substrate; a first electrode electrically connected to the thin film transistor; a hole injection layer on the first electrode; an emission layer on the hole injection layer; an electron injection layer on the emission layer; a first intermediate layer on the electron injection layer; and a second electrode on the first intermediate layer.

16 Claims, 4 Drawing Sheets

(56) References Cited

U.S. PATENT DOCUMENTS

| | | | |
|---|---|---|---|
| 3,476,606 A * | 11/1969 | Owens | H01M 6/182 |
| | | | 429/219 |
| 5,677,572 A | 10/1997 | Hung et al. | |
| 2013/0181205 A1 | 7/2013 | Mima et al. | |

* cited by examiner

ORGANIC LIGHT EMITTING DIODE DISPLAY

CROSS-REFERENCE TO RELATED APPLICATION

This application claims priority to and the benefit of Korean Patent Application No. 10-2015-0074879 filed in the Korean Intellectual Property Office on May 28, 2015, the entire content of which is incorporated herein by reference.

BACKGROUND

1. Field

Aspects of embodiments of the present invention relate to an organic light emitting diode (OLED) display.

2. Description of the Related Art

Recently, consumer demand for light and slim monitors or televisions has increased, and due to such demand, cathode ray tubes (CRTs) have been replaced by alternative technologies, such as liquid crystal displays (LCDs). However, because LCDs are passive light-emitting devices, they may utilize separate backlights and may have limitations in terms of response speed and viewing angle.

Recently, organic light emitting diode (OLED) displays have been receiving great attention as display devices capable of overcoming such limitations, because OLED displays have, as self-light emitting devices, may have characteristics such as relatively wide viewing angles, relatively superior contrast, and relatively rapid response time.

OLED displays include organic light emitting elements for emitting light. In such organic light emitting elements, electrons injected from one electrode and holes injected from the other electrode are combined in the organic emission layer to generate excitons, and the generated excitons release energy to emit light.

However, related art OLED displays have problems in that they may require a relatively high driving voltage, may have relatively low luminance or low luminous efficiency, and may have a short light-emitting service life.

The above information disclosed in this Background section is only to enhance the understanding of the background of the invention and therefore it may contain information that does not constitute prior art.

SUMMARY

Aspects of embodiments of the present invention include an organic light emitting diode (OLED) display capable of increasing luminous efficiency by reducing interfacial resistance of electrodes of an organic light emitting element and forming a uniform surface.

An example embodiment of the present invention includes an OLED display including: a substrate; a thin film transistor on the substrate; a first electrode electrically connected to the thin film transistor; a hole injection layer on the first electrode; an emission layer on the hole injection layer; an electron injection layer on the emission layer; a first intermediate layer on the electron injection layer; and a second electrode on the first intermediate layer, wherein the first intermediate layer comprises a dipole material that is made of a first material comprising at least one element from Group I, Group II, lanthanide, or transition metals, and a second material comprising a halogen.

The first material may include one element from a Group I, Group II, or lanthanide metal, and one element from transition metals.

The first intermediate layer may include a ternary inorganic dipole material.

The first intermediate layer may include at least one of $LiAg_4I_5$, $NaAg_4I_5$, $KAg_4I_5$, $RbAg_4I_5$, $CsAg_4I_5$, $LiCu_4I_5$, $NaCu_4I_5$, $KCu_4I_5$, $RbCu_4I_5$, or $CsCu_4I_5$.

The first intermediate layer may have a thickness between 10 Å and 200 Å.

The electron injection layer may include a metal-based halogen dipole material.

The electron injection layer may include at least one of Group I, Group II, or lanthanide metals.

The hole injection layer may include a metal or nonmetal-based halogen dipole material.

The metal or nonmetal of the hole injection layer may include at least one of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, or Zn.

The OLED display may further include a second intermediate layer between the first electrode and the first layer, wherein the second intermediate layer includes a dipole material comprising a third material comprising at least one of a Group I, Group II, lanthanide, or transition metal, and a fourth material comprising a halogen.

The third material may include one element from a Group I, Group II, or lanthanide metal, and one element from transition metals.

The first and second intermediate layers may include a same material.

The first and second intermediate layers may include a ternary inorganic dipole material, and the ternary inorganic dipole material is at least one of $LiAg_4I_5$, $NaAg_4I_5$, $KAg_4I_5$, $RbAg_4I_5$, $CsAg_4I_5$, $LiCu_4I_5$, $NaCu_4I_5$, $KCu_4I_5$, $RbCu_4I_5$, or $CsCu_4I_5$.

According to some example embodiments of the present invention, an organic light emitting diode (OLED) display includes: a substrate; a thin film transistor on the substrate; a first electrode electrically connected to the thin film transistor; an intermediate layer on the first electrode; a hole injection layer on the intermediate layer; an emission layer on the hole injection layer; an electron injection layer on the emission layer; and a second electrode on the electron injection layer, wherein the intermediate layer comprises a dipole material comprising a first material comprising at least one of a Group I, Group II, lanthanide, or transition metal, and a second material comprising a halogen.

The first material includes one element from Group I, Group II, or lanthanide metals and one element from transition metals.

The intermediate layer may include a ternary inorganic dipole material, and the ternary inorganic dipole material comprises at least one of $LiAg_4I_5$, $NaAg_4I_5$, $KAg_4I_5$, $RbAg_4I_5$, $CsAg_4I_5$, $LiCu_4I_5$, $NaCu_4I_5$, $KCu_4I_5$, $RbCu_4I_5$, or $CsCu_4I_5$.

As previously discussed, according to some example embodiments of the present invention, the intermediate layer including an ionic conductor material may be formed between the electrode and the emission layer to reduce the interfacial resistance of the electrode and to uniformly form the surface, thereby increasing luminous efficiency of the OLED display.

DETAILED DESCRIPTION

Figure 1:
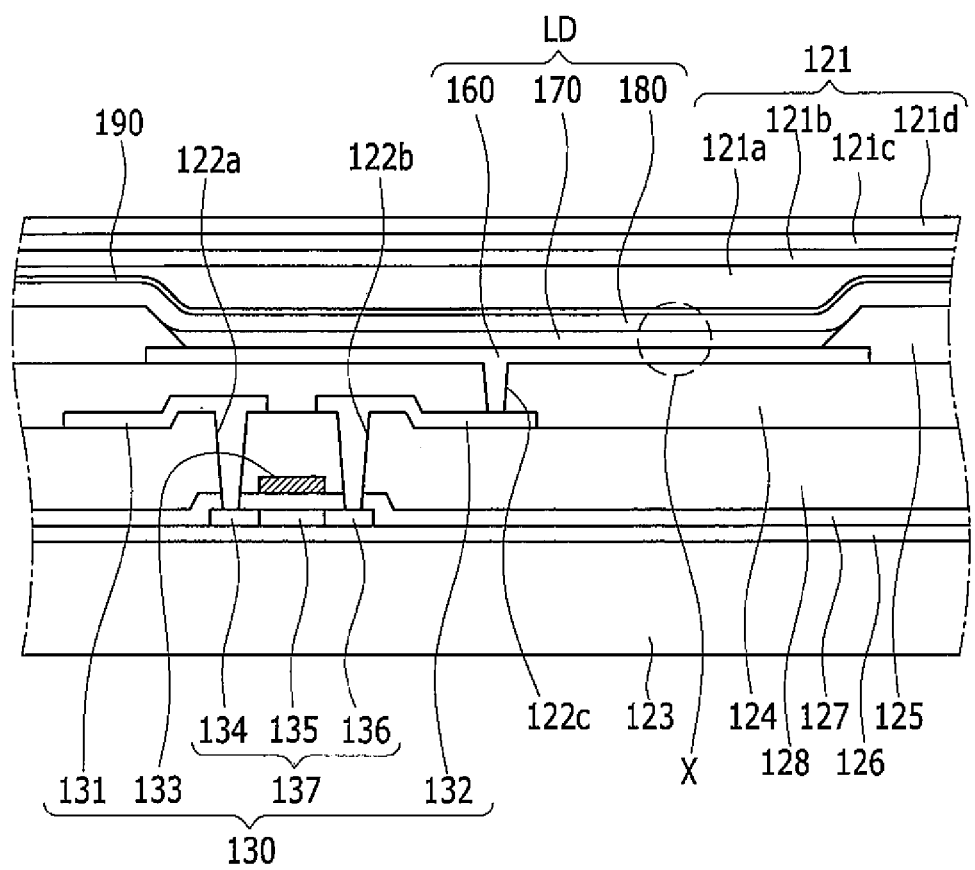
FIG. 1 is a cross-sectional view of an organic light emitting diode (OLED) display according to an example embodiment of the present invention.

Aspects of example embodiments of the present invention will be described more fully hereinafter with reference to the accompanying drawings, in which example embodiments of the present invention are shown. As those skilled in the art would realize, the described embodiments may be modified in various different ways, all without departing from the spirit or scope of the present invention.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

In the drawings, the thickness of layers, films, panels, regions, etc. are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

An organic light emitting diode (OLED) display according to some example embodiments of the present invention will now be described in more detail with reference to the drawings. Here, a structure of the OLED display includes a structure for a driving thin film transistor and an emission layer.

Figure 2:
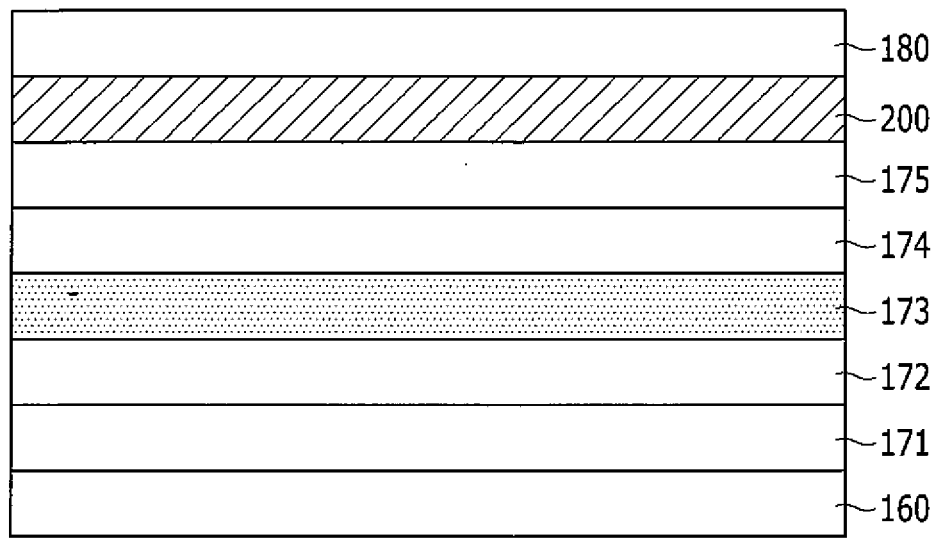
FIG. 2 is an enlarged partial cross-sectional view of the organic light emitting element of FIG. 1.

With reference first to FIGS. 1 and 2, an OLED display according to some example embodiments of the present invention will now be described in more detail.

FIG. 1 is a cross-sectional view of an OLED display according to some example embodiments of the present invention, and FIG. 2 is an enlarged partial cross-sectional view of the organic light emitting element of FIG. 1.

Referring to FIGS. 1 and 2, the OLED display according to some example embodiments of the present invention includes a substrate 123, a thin film transistor 130, a first electrode 160, first layers 171 and 172, an intermediate layer 200, an emission layer 173, second layers 174 and 175, and a second electrode 180.

The first layers 171 and 172 may include a hole injection layer 171 and a hole transporting layer 172, and the second layers 174 and 175 may include an electron transporting layer 174 and an electron injection layer 175.

The first electrode 160 may be an anode and the second electrode 180 may be a cathode, but on the contrary, the first electrode 160 may be a cathode and the second electrode 180 may be an anode.

In this case, the substrate 123 is formed as an insulating substrate that is made of glass, quartz, ceramic, plastic, etc. However, the example embodiments of the present invention are not limited thereto, and the substrate 123 may be formed as a metallic substrate that is made of stainless steel or the like, and may be made of an organic material such as polycarbonate, polymethylmethacrylate, polyethylene terephthalate, polyethylene naphthalate, polyamide, polyether sulfone, polyimide, or a combination thereof, a silicon wafer, etc.

In addition, a substrate buffer layer 126 is formed on the substrate 123. The substrate buffer layer 126 serves to prevent or reduce penetration of impurity elements and to planarize a surface.

In this case, the substrate buffer layer 126 may be made of a variety of materials that can perform the above-described functions. For example, any one of a silicon nitride (SiNx) layer, a silicon oxide (SiOy) layer, and a silicon oxynitride (SiOxNy) layer may be used as the substrate buffer layer 126. Additionally, according to some embodiments of the present invention, the substrate buffer layer 126 may be omitted depending on a kind of the substrate 123 and a processing condition.

A driving semiconductor layer 137 is formed on the substrate buffer layer 126. The driving semiconductor layer 137 is formed as a polysilicon layer. In addition, the driving semiconductor layer 137 includes a channel region 135 in which impurities are not doped, and a source region 134 and a drain region 136 in which impurities are doped at opposite sides of the channel region 135. In this case, doped ion materials are P-type impurities such as boron (B), and, for example, $B_2H_6$ may be used. In this case, impurities may be dependent on kinds of thin film transistors.

A gate insulating layer 127 that is made of a silicon nitride (SiNx) or a silicon oxide (SiOy) is formed on the driving semiconductor layer 137. A gate line including a driving gate electrode 133 is formed on the gate insulating layer 127. In addition, the driving gate electrode 133 may be formed to overlap at least some of the driving semiconductor layer 137, and for example, the channel region 135.

On the other hand, an interlayer insulating layer 128 covering the driving gate electrode 133 is formed on the gate insulating layer 127. First and second contact holes 122a and 122b exposing the source and drain regions 134 and 136 of the driving semiconductor layer 137 are formed in the gate insulating layer 127 and the interlayer insulating layer 128. The interlayer insulating layer 128 may be made of a ceramic-based material such as a silicon nitride (SiNx) or a silicon oxide (SiOy), as is the gate insulating layer 127.

In addition, a data line including a driving source electrode 131 and a driving drain electrode 132 is formed on the interlayer insulating layer 128. The driving source electrode 131 and the driving drain electrode 132 are connected to the source and drain regions 134 and 136 of the driving semiconductor layer 137 via the first and second contact holes 122a and 122b that are respectively formed in the interlayer insulating layer 128 and the gate insulating layer 127.

As such, the driving thin film transistor 130 is formed by including the driving semiconductor layer 137, the driving gate electrode 133, the driving source electrode 131, and the driving drain electrode 132. The configuration of the driving thin film transistor 130 is not limited to the example described above, and can be modified in various ways to be disclosed configurations that can be easily practiced by those skilled in the art.

In addition, a planarization layer 124 covering the data line is formed on the interlayer insulating layer 128. The planarization layer 124 serves to eliminate and planarize a step to increase luminous efficiency of the organic light emitting element to be formed thereon. The planarization layer 124 includes a third contact hole 122c that exposes some of the drain electrode 132.

The planarization layer 124 may be made of one or more of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

Here, example embodiments according to the present invention are not limited to the structure described above, and either one of the planarization layer 124 and the interlayer insulating layer 128 may be omitted in some embodiments.

In this case, the first electrode 160 of the organic light emitting element, i.e., the pixel electrode 160, is formed on the planarization layer 124. That is, the OLED display includes a plurality of pixel electrodes 160 that are respectively arranged in a plurality of pixels. In this case, the plurality of pixel electrodes 160 are arranged to be separated from each other. The pixel electrode 160 is connected to the drain electrode 132 via the third contact hole 122c of the planarization layer 124.

A pixel definition layer 125 including an opening exposing the pixel electrode 160 is formed on the planarization layer 124. That is, the pixel definition layer 125 has a plurality of openings that are formed in each of the pixels. In this case, a light-emitting diode layer 170 may be formed in each of the openings that are formed by the pixel definition layer 125. Accordingly, a pixel area in which each of organic emission layers are formed may be defined by the pixel definition layer 125.

In this case, the pixel electrode 160 is arranged to correspond to the openings of the pixel definition layer 125. However, the pixel electrode 160 may not be arranged only in the opening of the pixel definition layer 125, but may be arranged below the pixel definition layer 125 such that some of the pixel electrode 160 overlaps the pixel definition layer 125.

The pixel definition layer 125 may be made of a polyacrylate resin, a polyimide resin, or a silica-based inorganic material.

On the other hand, the light-emitting diode layer 170 is formed on the pixel electrode 160. A structure of the light-emitting diode layer 170 will be described in more detail below.

In addition, the second electrode 180 (e.g., the common electrode 180), may be formed on the light-emitting diode layer 170. As such, the organic light emitting element LD including the pixel electrode 160, the light-emitting diode layer 170, and the common electrode 180 is formed.

The pixel electrode 160 and the common electrode 180 may be respectively made of a transparent conductive material or a transflective or reflective conductive material. Depending on kinds of materials for forming the pixel electrode 160 and the common electrode 180, the OLED display may be a top emission type, a bottom emission type, or a dual emission type.

An overcoat 190 covering and protecting the common electrode 180 may be formed as an organic layer on the common electrode 180.

In addition, a thin film encapsulation layer 121 is formed on the overcoat 190. The thin film encapsulation layer 121 seals and protects the organic light emitting element LD and a driving circuit unit, which are formed on the substrate 123, from the outside.

The thin film encapsulation layer 121 includes organic encapsulation layers 121a and 121c and inorganic encapsulation layers 121b and 121d that are alternately laminated one by one. FIG. 1 illustrates, as an example, a case in which two organic encapsulation layers 121a and 121c and two inorganic encapsulation layers 121b and 121d are alternately laminated one by one to form the thin film encapsulation layer 121, but embodiments of the present invention are not limited thereto.

With reference now to FIG. 2, the organic light emitting element of the present invention will be described in more detail. FIG. 2 is an enlarged partial cross-sectional view of the organic light emitting element of FIG. 1.

The organic light emitting element according to example embodiments of the present invention (e.g., the portion X of FIG. 1) has a structure in which the first electrode 160, the hole injection layer 171, the hole transporting layer 172, the emission layer 173, the electron transporting layer 174, the electron injection layer 175, the intermediate layer 200, and the second electrode 180 are sequentially laminated.

That is, the light-emitting diode layer 170 of FIG. 1 includes the hole injection layer 171, the hole transporting layer 172, the emission layer 173, the electron transporting layer 174, the electron injection layer 175, and the intermediate layer 200 of FIG. 2.

When the first electrode 160 is an anode, it may include a material that is selected to have a high work function for allowing easy injection of holes.

The first electrode 160 according to some example embodiments of the present invention may be a transparent electrode, and may be formed to be thin using a conductive oxide such as indium tin oxide (ITO), indium zinc oxide (IZO), tin oxide ($SnO_2$), zinc oxide (ZnO), or a combination thereof, or a metal such as aluminum (Al), silver (Ag), magnesium (Mg), etc. In addition, the first electrode 160 is not limited thereto, and may be formed to have a structure in which two or more layers of the conductive oxide and the metal material are laminated.

The hole injection layer 171 may be arranged on the first electrode 160. In this case, the hole injection layer 171 may serve to improve injection of holes into the hole transporting layer 172 from the first electrode 160. The hole injecting layer 171 may include a dipole material in which a metal or nonmetal and halogen elements such as F, Cl, Br, and I are combined. However, the hole injecting layer 171 is not limited thereto, and may be made of any other organic or inorganic materials.

The metal or nonmetal may be at least one element selected from the group consisting of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, and Zn.

The hole injection layer 171 may include copper iodide (CuI), cobalt iodide ($CoI_2$), copper phthalocyanine (CuPc), etc., but it is not limited thereto.

The hole injecting layer 171 may have a thickness of between about 25 nm and about 35 nm.

The hole transporting layer 172 may be arranged on the hole injection layer 171. The hole transporting layer 172 may perform a function of smoothly transporting holes transferred from the hole injection layer 171. For example, the hole transporting layer 172 may include NPD (N,N-dinaphthyl-N,N'-diphenyl benzidine), TPD (N,N'-bis-(3-methylphenyl)-N,N'-bis-(phenyl)-benzidine), s-TAD, MTDATA (4,4',4"-tris (N-3-methylphenyl-N-phenyl-amino)-triphenylamine), etc., but embodiments of the present invention are not limited thereto.

On the other hand, the hole injection layer 171 may include the same material as that included in the hole transporting layer 172 to which a P-type dopant is applied, thereby improving a hole injection characteristic by decreasing a driving voltage of the organic light emitting element.

In this case, the hole transporting layer 172 may have a thickness in a range of about 15 nm to about 25 nm.

Aspects of example embodiments of the present invention have been described to have the structure in which, the hole injection layer 171 and the hole transporting layer 172 are laminated, but embodiments of the present invention are not limited thereto, and the hole injection layer 171 and the hole transporting layer 172 may be formed as a single layer.

The emission layer 173 is formed on the hole transporting layer 172. The emission layer 173 includes a light-emitting material that exhibits a specific color. For example, the emission layer 173 may exhibit primary colors such as blue, green, and red or a combination thereof.

In this case, the emission layer 173 may have a thickness in a range of about 10 nm to about 50 nm.

The emission layer 173 includes a host and a dopant. The emission layer 173 may include a material that emits red, green, blue, and white light, and may be formed by using a phosphorescent or fluorescent material.

When emitting red light, the emission layer 173 includes a host material that includes CBP (carbazole biphenyl) or mCP (1,3-bis(carbazol-9-yl), and may be made of a phosphorescent material including a dopant including at least one selected from PIQIr(acac) (bis(1-phenylisoquinoline)acetylacetonate iridium), PQIr(acac) (bis(1-phenylquinoline) acetylacetonate iridium), PQIr(tris(1-phenylquinoline) iridium), and PtOEP (octaethylporphyrin platinum), or alternatively, may be made of a fluorescent material including PBD:Eu(DBM)3(Phen) or perylene, but embodiments of the present invention are not limited thereto.

When emitting green light, the emission layer 173 includes a host material that includes CBP or mCP, and may be made of a phosphorescent material that includes a dopant material including Ir(ppy)3(fac-tris(2-phenylpyridine) iridium), or alternatively, may be made of a fluorescent material including Alq3(tris(8-hydroxyquinolino)aluminum), but embodiments of the present invention are not limited thereto.

When emitting blue light, the emission layer 173 includes a host material including CBP or mCP, and may be made of a phosphorescent material that includes a dopant material including (4,6-F2ppy)2Irpic. Alternatively, the emission layer 173 may be made of a fluorescent material including at least one selected from a group of spiro-DPVBi, spiro-6P, distyryl benzene (DSB), distyrylarylene (DSA), a PFO-based polymer, and a PPV-based polymer, but embodiments of the present invention are not limited thereto.

On the other hand, the electron transporting layer 174 may be arranged on the emission layer 173. In this case, the electron transporting layer 174 may transfer electrons from the second electrode 180 to the emission layer 173. In addition, the electron transporting layer 174 may prevent or reduce instances of holes injected from the first electrode 160 from moving to the second electrode 180 through the emission layer 173. That is, the electron transporting layer 174 serves as a hole blocking layer, and helps combination of the holes and electrons in the emission layer 173.

In this case, the electron transporting layer 174 may be made of any one or more selected from a group of Alq3(tris (8-hydroxyquinolino)aluminum), PBD, TAZ, spino-PBD, BAlq, and SAlq, but embodiments of the present invention are not limited thereto.

The electron injection layer 175 is formed on the electron transporting layer 174. The electron injection layer 175 may serve to improve injection of electrons into the electron transporting layer 174 from the second electrode 180.

The electron injection layer 175 according to the exemplary embodiment of the present invention includes a metal-based halogen dipole material. The electron injection layer 175 may be a dipole material in which any one material selected from a halogen element such as F, Cl, Br, and I is combined with any one material selected from Group I, Group II, and lanthanide metals such as Li, Na, K, Rb, Cs, Fr, Be, Mg, Ca, Sr, Ba, Ra, La, Yb, Lu, Tm, Ce, Pr, and Nd.

The electron injection layer 175 may be formed as a single layer of a metal-based halogen dipole material or a double layer including a metal and a metal-based halogen material.

The electron injection layer 175 may be formed using a sputtering method.

The intermediate layer 200 is formed on the electron injection layer 175. The intermediate layer 200 serves to reduce interfacial resistance between the second electrode 180 and the electron injection layer 175 that are to be described below, and to allow a surface of the second electrode 180 to be uniformly formed.

That is, the intermediate layer 200 may serve as an ionic conductor by reducing the interfacial resistance between the second electrode 180 and the electron injection layer 175 to allow electrons to be smoothly injected into the electron injection layer 175 from the second electrode 180.

The intermediate layer 200 may be a dipole material that is made of a first material including at least one element from Group I, Group II, lanthanide, and transition metals, and a second material including a halogen. In this case, the first material may include one element from Group I, Group II, and lanthanide metals and at least one element from transition metals, and the intermediate layer 200 according to the current exemplary embodiment may preferably be a ternary dipole material that includes the first and second materials.

Here, the first material may include Group I, Group II, and lanthanide metals such as Li, Na, K, Rb, Cs, Fr, Be, Mg, Ca, Sr, Ba, Ra, La, Yb, Lu, Tm, Ce, Pr, or Nd.

Specifically, the intermediate layer 200 may be a ternary inorganic dipole, and may include, for example, one or more compounds selected from $LiAg_4I_5$, $NaAg_4I_5$, $KAg_4I_5$, $RbAg_4I_5$, $CsAg_4I_5$, $LiCu_4I_5$, $NaCu_4I_5$, $KCu_4I_5$, $RbCu_4I_5$, and $CsCu_4I_5$, but it is not limited thereto.

The intermediate layer 200 should preferably have a thickness of between about 10 Å and about 200 Å, and this is because, if the thickness is less than 10 Å, an effect of the intermediate layer 200 may be insufficient, and if it exceeds 200 Å, the intermediate layer 200 may cause some problems in injecting electrons into the electron injection layer 175.

The intermediate layer 200 may be formed even at a low temperature because it can be formed using a thermal evaporation method. However, this is not restrictive, and the intermediate layer 200 may be formed using various methods such as sputtering, chemical vapor deposition (CVD), atomic layer deposition (ALD), and chemical solution deposition (CSD) methods.

The second electrode 180 is formed on the intermediate layer 200. In the OLED display according to example embodiments of the present invention, the first electrode 160 may be an anode, and the second electrode 180 may be a cathode. The second electrode 180 is also a transparent electrode and may be formed to be thin using a conductive oxide such as indium tin oxide (ITO), indium zinc oxide (IZO), tin oxide ($SnO_2$), zinc oxide (ZnO), or a combination thereof or a metal such as aluminum (Al), silver (Ag), magnesium (Mg), etc. In addition, the first electrode 160 is not limited thereto, and may be formed to have a structure in which two or more layers of the conductive oxide and the metal material are laminated.

Figure 3:
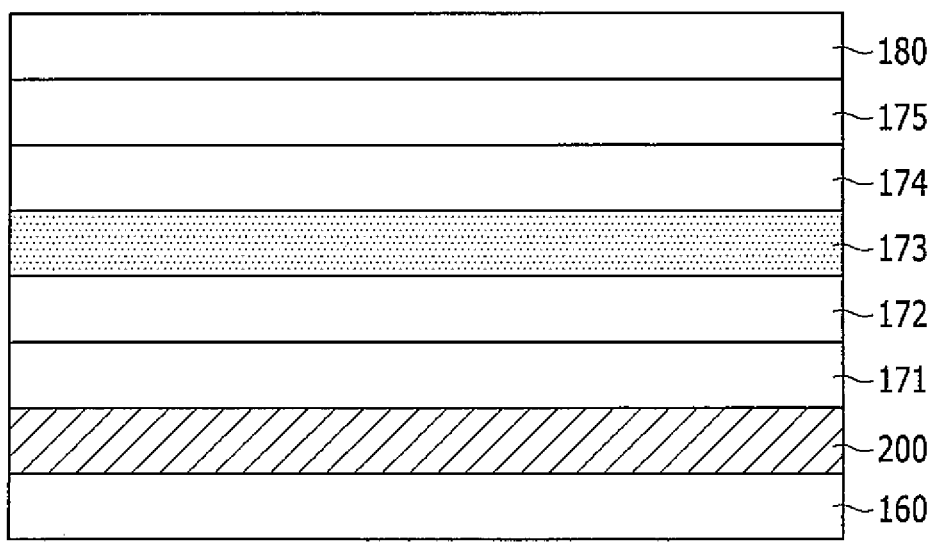
FIG. 3 is an enlarged partial cross-sectional view of an organic light emitting element according to some example embodiments of the present invention.
Figure 4:
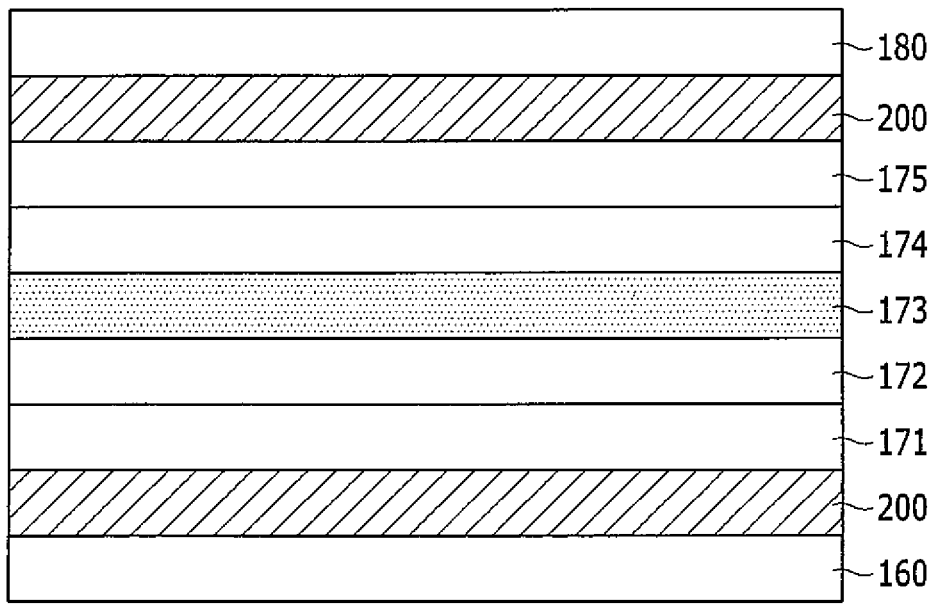
FIG. 4 is an enlarged partial cross-sectional view of an organic light emitting element according to some example embodiments of the present invention.

With reference now to FIGS. 3 and 4, an OLED display according to another example embodiment of the present invention will be described.

FIG. 3 is an enlarged partial cross-sectional view of an organic light emitting element according to some example embodiments of the present invention, and FIG. 4 is an enlarged partial cross-sectional view of an organic light emitting element according to some example embodiments of the present invention.

OLED displays according to this and further example embodiments of the present invention in FIGS. 3 and 4 are the same or similar as the OLED display according to the example embodiment previously discussed with respect to FIG. 2, except for a position of the intermediate layer 200, so some repeated description thereof will be omitted.

First, the OLED display according to the some example embodiments of the present invention illustrated in FIG. 3 will be described.

As illustrated in FIG. 3, an intermediate layer 200 of the OLED display according to some example embodiments of the present invention is formed between a first electrode 160 and a hole injection layer 171.

Most of the description of the intermediate layer 200 previously discussed in the example embodiment of FIG. 2 may be applied to the intermediate layer 200 according to the current example embodiment, and in this case, the intermediate layer 200 may serves as an ionic conductor that allows holes to be smoothly injected by reducing interfacial resistance between the first electrode 160 and the hole injection layer 171.

Next, an intermediate layer 200 of the OLED display according to some example embodiments of the present invention depicted in FIG. 4 is formed both between a first electrode 160 and a hole injection layer 171 and between a second electrode 180 and an electron injection layer 175.

In this case, the intermediate layer 200 reduces not only interfacial resistance between the first electrode 160 and the hole injection layer 171, but also interfacial resistance between the second electrode 180 and the electron injection layer 175, thereby serving as an ionic conductor such that it allows holes and electrons to be smoothly injected.

As previously discussed, according to some example embodiments of the present invention, the intermediate layer including an ionic conductor material can be formed between the electrode and the emission layer to reduce the interfacial resistance of the electrode and to more uniformly form the surface, thereby increasing luminous efficiency of the OLED display.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims, and their equivalents.

| Description of Some of the Symbols | |
|---|---|
| 123: substrate | 130: thin film transistor |
| 160: first electrode | 180: second electrode |
| 171: hole injection layer | 172: hole transporting layer |
| 173: emission layer | 174: electron transporting layer |
| 175: electron injection layer | 200: intermediate layer |

What is claimed is:

1. An organic light emitting diode (OLED) display comprising:
   a substrate;
   a thin film transistor on the substrate;
   a first electrode electrically connected to the thin film transistor;
   a hole injection layer on the first electrode;

an emission layer on the hole injection layer;

an electron injection layer on the emission layer;

a first intermediate layer on the electron injection layer; and a second electrode on the first intermediate layer, wherein the first intermediate layer comprises a dipole material that is made of a first material comprising at least one element from Group I, Group II, lanthanide, or transition metals, and a second material comprising a halogen.

2. The OLED display of claim 1, wherein the first material comprises one element from a Group I, Group II, or lanthanide metal, and one element from transition metals.

3. The OLED display of claim 2, wherein the first intermediate layer comprises a ternary inorganic dipole material.

4. The OLED display of claim 3, wherein the first intermediate layer comprises at least one of $LiAg_4I_5$, $NaAg_4I_5$, $KAg_4I_5$, $RbAg_4I_5$, $CsAg_4I_5$, $LiCu_4I_5$, $NaCu_4I_5$, $KCu_4I_5$, $RbCu_4I_5$, or $CsCu_4I_5$.

5. The OLED display of claim 3, wherein the first intermediate layer has a thickness between 10 Å and 200 Å.

6. The OLED display of claim 1, wherein the electron injection layer comprises a metal-based halogen dipole material.

7. The OLED display of claim 6, wherein the electron injection layer comprises at least one of Group I, Group II, or lanthanide metals.

8. The OLED display of claim 6, wherein the hole injection layer comprises a metal or nonmetal-based halogen dipole material.

9. The OLED display of claim 8, wherein the metal or nonmetal of the hole injection layer comprises at least one of Ag, Au, B, Be, C, Co, Cr, Cu, Fe, Ng, Ir, Mo, Nb, Ni, Os, Pd, Pt, Re, Rh, Ru, Sb, Se, Si, Sn, Ta, Te, Ti, V, W, or Zn.

10. The OLED display of claim 2, further comprising a second intermediate layer between the first electrode and the first layer, wherein the second intermediate layer comprises a dipole material comprising a third material comprising at least one of a Group I, Group II, lanthanide, or transition metal, and a fourth material comprising a halogen.

11. The OLED display of claim 10, wherein the third material comprises one element from a Group I, Group II, or lanthanide metal, and one element from transition metals.

12. The OLED display of claim 10, wherein the first and second intermediate layers comprise a same material.

13. The OLED display of claim 12, wherein the first and second intermediate layers comprise a ternary inorganic dipole material, and the ternary inorganic dipole material is at least one of $LiAg_4I_5$, $NaAg_4I_5$, $KAg_4I_5$, $RbAg_4I_5$, $CsAg_4I_5$, $LiCu_4I_5$, $NaCu_4I_5$, $KCu_4I_5$, $RbCu_4I_5$, or $CsCu_4I_5$.

14. An organic light emitting diode (OLED) display comprising:

a substrate;

a thin film transistor on the substrate;

a first electrode electrically connected to the thin film transistor;

an intermediate layer on the first electrode;

a hole injection layer on the intermediate layer;

an emission layer on the hole injection layer;

an electron injection layer on the emission layer; and a second electrode on the electron injection layer, wherein the intermediate layer comprises a dipole material comprising a first material comprising at least one of a Group I, Group II, lanthanide, or transition metal, and a second material comprising a halogen.

15. The OLED display of claim 14, wherein the first material comprises one element from Group I, Group II, or lanthanide metals and one element from transition metals.

16. The OLED display of claim 15, wherein the intermediate layer comprises a ternary inorganic dipole material, and the ternary inorganic dipole material comprises at least one of $LiAg_4I_5$, $NaAg_4I_5$, $KAg_4I_5$, $RbAg_4I_5$, $CsAg_4I_5$, $LiCu_4I_5$, $NaCu_4I_5$, $KCu_4I_5$, $RbCu_4I_5$, or $CsCu_4I_5$.

* * * * *